(12) United States Patent
Stark

(10) Patent No.: US 7,626,114 B2
(45) Date of Patent: Dec. 1, 2009

(54) THERMOELECTRIC POWER SUPPLY

(75) Inventor: Ingo Stark, Riverside, CA (US)

(73) Assignee: Digital Angel Corporation, St. Paul, MN (US)

( * ) Notice: Subject to any disclaimer, the term of this patent is extended or adjusted under 35 U.S.C. 154(b) by 250 days.

(21) Appl. No.: 11/511,563

(22) Filed: Aug. 29, 2006

(65) Prior Publication Data

US 2007/0289620 A1 Dec. 20, 2007

Related U.S. Application Data

(60) Provisional application No. 60/814,648, filed on Jun. 16, 2006.

(51) Int. Cl.
 *H01L 35/30* (2006.01)
(52) U.S. Cl. .................. 136/205; 136/200; 136/203; 136/242
(58) Field of Classification Search ......... 136/200–241; 257/246–470
See application file for complete search history.

(56) References Cited

U.S. PATENT DOCUMENTS

| 3,900,603 | A | | 8/1975 | Rittmayer et al. |
| 4,032,363 | A | * | 6/1977 | Raag ........................... 136/211 |
| 4,165,477 | A | * | 8/1979 | Comte ......................... 320/101 |
| 5,705,770 | A | * | 1/1998 | Ogasawara et al. ......... 136/205 |
| 5,883,563 | A | | 3/1999 | Horio et al. |

(Continued)

FOREIGN PATENT DOCUMENTS

| DE | 297 23 309 U1 | 9/1998 |
| DE | 10333084 | 2/2005 |
| DE | 102006040576.5 | 8/2006 |
| JP | S51-013587 | 2/1976 |

(Continued)

OTHER PUBLICATIONS

M. Stolzer, "Crystalline structure and thermoelectric properties versus growing conditions of sputtering-deposited (Bi1-xSbx)2Te3 films with 0< x < 0.85," Proceedings ICT 1997 XVI International Conference on Thermoelectrics 1997, Dresden, Germany Aug. 26-29, 1997, pp. 93-96, available at <http//ieeexplore.ieee.org/articleSale/Sarticlel.jsp?arnumber=666982>, last visited Apr. 4, 2009.

(Continued)

*Primary Examiner*—Nam X Nguyen
*Assistant Examiner*—Bach T Dinh
(74) *Attorney, Agent, or Firm*—NovaTech IP Law

(57) ABSTRACT

A thermoelectric power supply converts thermal energy into a high power output with voltages in the Volt-range for powering a microelectronic device and comprises an in-plane thermoelectric generator, a cross-plane thermoelectric generator, an initial energy management assembly, a voltage converter and a final energy management assembly. The in-plane thermoelectric generator produces a high thermoelectric voltage at low power output. The initial energy management assembly rectifies and limits the thermoelectric voltage and stores and releases power to the voltage converter. The cross-plane thermoelectric generator generates a high power output at low thermoelectric voltage. Once activated by the in-plane thermoelectric generator, the voltage converter multiplies the low thermoelectric voltage output of the cross-plane thermoelectric generator. After multiplying the relatively low voltage provided by the cross-plane thermoelectric generator, the voltage converter supplies electrical energy to the final energy management assembly which rectifies and limits the voltage and stores and releases energy to an external power receiver such as the microelectronic device.

28 Claims, 5 Drawing Sheets

U.S. PATENT DOCUMENTS

| | | | |
|---|---|---|---|
| 6,025,554 A * | 2/2000 | Macris | 136/205 |
| 6,291,760 B1 * | 9/2001 | Mitamura | 136/205 |
| 6,320,280 B1 * | 11/2001 | Kanesaka | 307/72 |
| 6,459,658 B1 * | 10/2002 | Fujita et al. | 368/203 |
| 2003/0041892 A1 | 3/2003 | Fleurial et al. | |
| 2004/0231714 A1 * | 11/2004 | Stark et al. | 136/211 |
| 2004/0238022 A1 * | 12/2004 | Hiller et al. | 136/203 |
| 2004/0242169 A1 | 12/2004 | Albsmeier et al. | |
| 2005/0139250 A1 * | 6/2005 | DeSteese et al. | 136/212 |
| 2006/0037380 A1 | 2/2006 | Bulst et al. | |
| 2008/0057611 A1 | 3/2008 | Stordeur et al. | |

FOREIGN PATENT DOCUMENTS

| | | |
|---|---|---|
| JP | S53-031985 | 3/1978 |
| JP | H2-155280 | 6/1990 |
| JP | H3-201577 | 9/1991 |
| JP | H11-177154 | 7/1999 |
| JP | 2000-261052 | 9/2000 |
| WO | WO 89/07836 A1 | 8/1989 |
| WO | WO 02/095707 A1 | 11/2002 |
| WO | WO 03/015186 A2 | 2/2003 |
| WO | WO 2006/001827 A2 | 1/2006 |

OTHER PUBLICATIONS

G. Jeffrey Snyder et al., "Thermoelectric microdevice fabricated by a MEMS-like electrochemical process", Nature Materials, published online Jul. 27, 2003, pp. 528-531, vol. 2, Nature Publishing Group, USA.

M. Strasser et al., "Analysis of a CMOS low power thermoelectric generator", The 14th European Conference on Solid-State Transducers, Aug. 27-30, 2000, pp. 17-20, Copenhagen, Denmark.

H. Glosch et al., "A thermoelectric converter for energy supply", Sensors and Actuators vol. 74 (1999), pp. 246-250, Elsevier, Germany.

Marc Strasser., "Miniaturized thermoelectric generators based on poly-si and poly-sige surface micromachining", 2 pages, Munich University of Technology, Institute for Physics of Electrotechnology, Germany (Unknown publication date).

Wenmin Qu et al., "Microfabrication of termoelectric generators on flexible foil substrates as a power source for autonomous microsystems", Journal of Micromechanics and Microengineering, Nov. 2001 (estimated publication date), pp. 146-152, Institute of Physica Publishing.

H. Bottner, "MicroPelt® Miniaturized Thermoelectric Devices: Small size, high cooling power densities, short response time", 8 pages, Germany, (Unknown publication date).

Harald Bottner et al., "New thermoelectric Components Using Microsystem Technologies", Journal of Microelectromechanical Systems, vol. 13, No. 3, Jun. 2004 (estimated publication date), pp. 414-420.

H. Bottner et al., "MicroPelt®: State of the art, road map and applications", 4 pages, Germany, (Unknown publication date).

Matthias Stordeur and Guido Willers, "Thermorelectric Films-Potential for new miniaturized devices", 12 pages, Halle, Germany, (Unknown publication date).

Stark, Ingo and Stordeur, Matthias, "New Micro Thermoelectric Devices Based on Bismuth Telluride-Type Thin Solid Films", 18th International Conference on Thermoelectrics, 1999, pp. 465-472, Germany.

Stordeur, Matthias and Stark, Ingo, "Low Power Thermoelectric Generator-self sufficient energy supply for micro systems", 16th International Conference of Thermoelectric, 1997, pp. 575-577, Germany.

Stolzer, M. et al., "Preparation of Highly Effective p-Bi0.5Sb1.5Te3 and n-Bi2Te2.7Se0.3 Films", 15th International Conference on Thermoelectrics, 1996, pp. 445-449, Germany.

Yamashita, Osamu et al., "Bismuth telluride compounds with high thermoelectric figures of merit", Journal of Applied Physics, vol. 93 No. 1, Jan. 1, 2003, pp. 368-374, American Institute of Physics, Japan.

\* cited by examiner

THERMOELECTRIC POWER SUPPLY

CROSS-REFERENCE TO RELATED APPLICATIONS

The present application claims the benefit of U.S. Provisional Application No. 60/814,648, entitled THERMOELECTRIC POWER SUPPLY and filed on Jun. 16, 2006, the entire contents of which is herein incorporated by reference. The present application is also related to commonly-owned U.S. patent application Ser. No. 11/352,113 filed on Feb. 10, 2006 and entitled IMPROVED LOW POWER THERMOELECTRIC GENERATOR, which is a continuation-in-part application of U.S. application Ser. No. 11/185,312, filed on Nov. 17, 2005 and entitled LOW POWER THERMOELECTRIC GENERATOR, which is a continuation application of U.S. application Ser. No. 10/440,992 filed on May 19, 2003 and entitled LOW POWER THERMOELECTRIC GENERATOR, now U.S. Pat. No. 6,958,443, the entire contents of each being expressly incorporated by reference herein.

STATEMENT RE: FEDERALLY SPONSORED RESEARCH/DEVELOPMENT (Not Applicable)

BACKGROUND

The present invention pertains generally to thermoelectric devices and, more particularly, to a self-sufficient thermoelectric power supply that is specifically adapted to produce a relatively high-voltage power output such as for powering microelectronic devices.

The increasing trend toward miniaturization of microelectronic devices necessitates the development of miniaturized power supplies. Batteries and solar cells are traditional power sources for such microelectronic devices. However, the power that is supplied by batteries dissipates over time requiring that the batteries be periodically replaced. Solar cells, although having an effectively unlimited useful life, may only provide a transient source of power as the sun or other light sources may not always be available. Furthermore, solar cells require periodic cleaning of their surfaces in order to maintain efficiency of energy conversion.

Thermoelectric generators are self-sufficient energy sources that convert thermal energy into electrical energy according to the Seebeck effect—a phenomenon whereby heat differences may be converted into electricity due in large part to charge carrier diffusion in a conductor. Electrical power may be generated under the Seebeck effect by utilizing thermocouples which are each comprised of a pair of dissimilar metals (n-type and p-type) joined at one end. N-type and p-type refers to the respective negative and positive types of charge carriers within the material.

The temperature gradient that exists between the ends of the thermocouple may be artificially applied or it may be naturally-occurring as waste heat or as dissipated heat that is constantly rejected by the human body. In a wristwatch, one side is typically exposed to air at ambient temperature while the opposite side is exposed to the higher temperature of the wearer's skin. Thus, a small temperature gradient is present across the thickness of the wristwatch. A thermoelectric generator may be incorporated into the wristwatch to take advantage of the dissipated or waste heat and generate a supply of power sufficient to operate the wristwatch as a self-contained unit. Advantageously, many microelectronic devices that are similar in size to a typical wristwatch require only a small amount of power and therefore may also be compatible for powering by a thermoelectric generator.

The continuous development that is occurring in the microelectronics industry has led to the increasing miniaturization of certain electronic applications with a concomitant reduction in power consumption of many modern electronic devices. This reduction in power requirements for such electronic devices has enabled the employment of alternative energy sources such as thermoelectric generators.

When used as thermal energy harvesting devices for recovering thermal energy as dissipated heat which is typically lost to the environment, such thermoelectric generators may be utilized to power microelectronics or sensor systems. As the functional density of such modern electronic devices increases due in part to the integration of the many subcomponents that make up such electronic devices, power consumption of the devices has shrunk to the micro-watt and nano-watt level. Often however, a higher power is required for many microelectronic devices. This higher power requirement is often in the milli-watt range.

In view of the above-described developments in microelectronic miniaturization, there exists a need in the art for a power supply for such microelectronic devices that is capable of providing an essentially continuous supply of power thereto. Furthermore, there exists a need in the art for a power supply for microelectronic devices that does not require periodic replacement of the power source.

In addition, there exists a need in the art for a power supply for microelectronic devices that can provide a stable and efficient source of power thereto and which has an effectively unlimited useful life. Finally, there exists a need in the art for a power supply such as may be used for microelectronic devices that is capable of converting essentially constant energy sources into electrical energy using only small temperature gradients.

BRIEF SUMMARY

The present invention specifically address and alleviates the above-mentioned needs associated with power supplies for microelectronic devices by providing a thermoelectric power supply that is specifically adapted to convert thermal energy into electrical energy from only small temperature gradients such as those occurring due to body or waste heat. More particularly, the present invention provides thermoelectric power supply that is capable of converting thermal energy into a relatively high power output with voltages in the Volt-range and which provides such power in a stable and reliable manner in order to power microelectronic devices such as sensor systems.

In its broadest sense, the invention comprises an in-plane thermoelectric generator, a cross-plane thermoelectric generator, an initial energy management assembly, a voltage converter and a final energy management assembly. The in-plane thermoelectric generator may be constructed similar to that shown and described in U.S. Pat. No. 6,958,443 issued to Stark et al., the entire contents of which is expressly incorporated by reference herein. The in-plane thermoelectric generator is generally constructed having a high number of thermocouples arranged in series and deposited on a substrate in order to produce a relatively high thermoelectric voltage but with low power output.

The initial energy management system receives the relatively high voltage and low power output from the in-plane thermoelectric generator and is specifically configured to rectify the thermoelectric voltage, protect against excess voltage via a diode, and store or accumulate a sufficient amount of energy in an energy storage element in order to activate the voltage converter. The initial energy management assembly may further include a voltage detector which is adapted to release power to the voltage converter upon obtaining a certain voltage threshold.

The voltage converter is specifically adapted to be activated or powered by voltage from the in-plane thermoelectric generator after processing by the initial energy management assembly. The voltage converter then is capable of converting the low voltage output from the cross-plane thermoelectric generator into a relatively high voltage using the principle of voltage multiplication such as by using a charge pump. More specifically, the voltage converter is adapted to multiply the relatively low thermoelectric voltage output of the cross-plane thermoelectric generator.

Advantageously, the cross-plane thermoelectric generator is adapted to generate a relatively high power output but at low voltage. Unfortunately, due to the geometric arrangement of the thermocouples that make up the cross-plane thermoelectric generator, the high power output is provided at a relatively low voltage at small temperature gradients such that the voltage is too low to drive most modern electronic circuitry. However, by combining the in-plane thermoelectric generator with the cross-plane thermoelectric generator, the combined advantages of each may be utilized to overcome the individual disadvantages in order to provide a thermoelectric power supply having an electric power output that is compatible for use in electronic devices requiring a high power consumption.

In the thermoelectric power supply of the present invention, after multiplying the relatively low voltage provided by the cross-plane thermoelectric generator, the voltage converter supplies electrical energy directly to the final energy management assembly which, like the initial energy management assembly, also rectifies and limits the voltage, charges an integrated energy storage element, detects the charging state of the stored energy via a voltage detector for release to an external power receiver such as a microelectronic device.

Optionally, a portion of the power released by the final energy management assembly may be re-circulated back to the voltage converter to drive the voltage converter which may provide the capability for reducing the power requirement, size and cost of the in-plane thermoelectric generator. Therefore, the initial energy management assembly is used to initially activate the voltage converter after which the initial energy management assembly may be used to provide energy to the final device.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Figure 1:
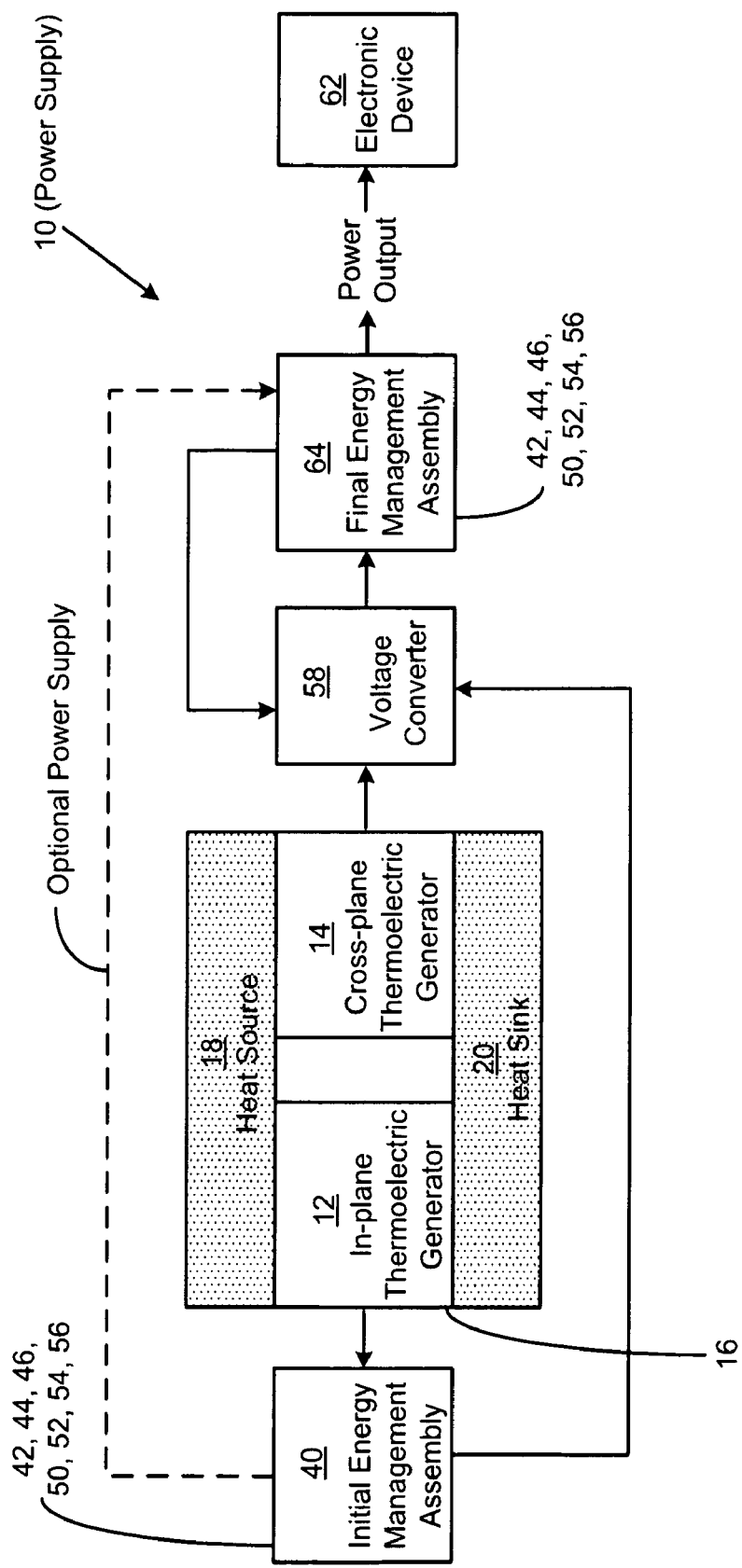
FIG. 1 is a schematic illustration of a thermoelectric power supply in one embodiment and which is comprised of an in-plane thermoelectric generator, a cross-plane thermoelectric generator, an initial energy management assembly, a voltage converter and a final energy management assembly.

Referring now to the drawings wherein the showings are for purposes of illustrating preferred embodiments of the present invention and not for purposes of limiting the same, shown in FIG. 1 is a schematic diagram of a thermoelectric power supply 10 that is specifically adapted to convert thermal energy into electrical energy from only small temperature gradients such as emitted by the body or waste heat. Advantageously, the power supply 10 of the present invention is adapted to produce electrical energy from such small temperature gradients with a high power output and with a stable and relatively high level voltage sufficient to power modern microelectronic devices and sensor systems.

In its broadest sense, the thermoelectric power supply 10 comprises an in-plane thermoelectric generator 12, a cross-plane thermoelectric generator 14, an initial energy management assembly 40, a voltage converter 58 and a final energy management assembly 64. The in-plane thermoelectric generator 12 provides the advantage of generating a relatively high voltage at even small temperature gradients.

Arranged with a relatively high number of thermocouples 38 connected in series, the in-plane thermoelectric generator 12 has a relatively high thermal resistance due to the arrangement of relatively long and thin n-type and p-type thermoelectric legs 34, 36 which are disposed in generally parallel and spaced relation to one another. More specifically, the length of such thermoelectric legs is in the millimeter range wherein the thickness of such legs is in the order of magnitude of microns up to tens of microns. In this regard, the ratio of length of the thermoelectric legs to the thickness thereof is such that the amount of heat flowing through the in-plane thermoelectric generator 12 is relatively small.

Unfortunately, the arrangement of the in-plane thermoelectric generator 12 results in the creation of a relatively high electrical resistance due as well as to the relatively large number of thermocouples 38 that are electrically connected in series. In addition, high electrical resistance is a result of the relatively large ratio of length of the thermoelectric legs to cross-section thereof. This high electrical resistance results in a relatively low power output. Furthermore, the in-plane thermoelectric generator 12 arrangement results in a relatively low level of efficiency as a result of parasitic heat flow through the substrate 26 onto which the n-type and p-type thermoelectric legs 34, 36 are deposited.

Figure 2:
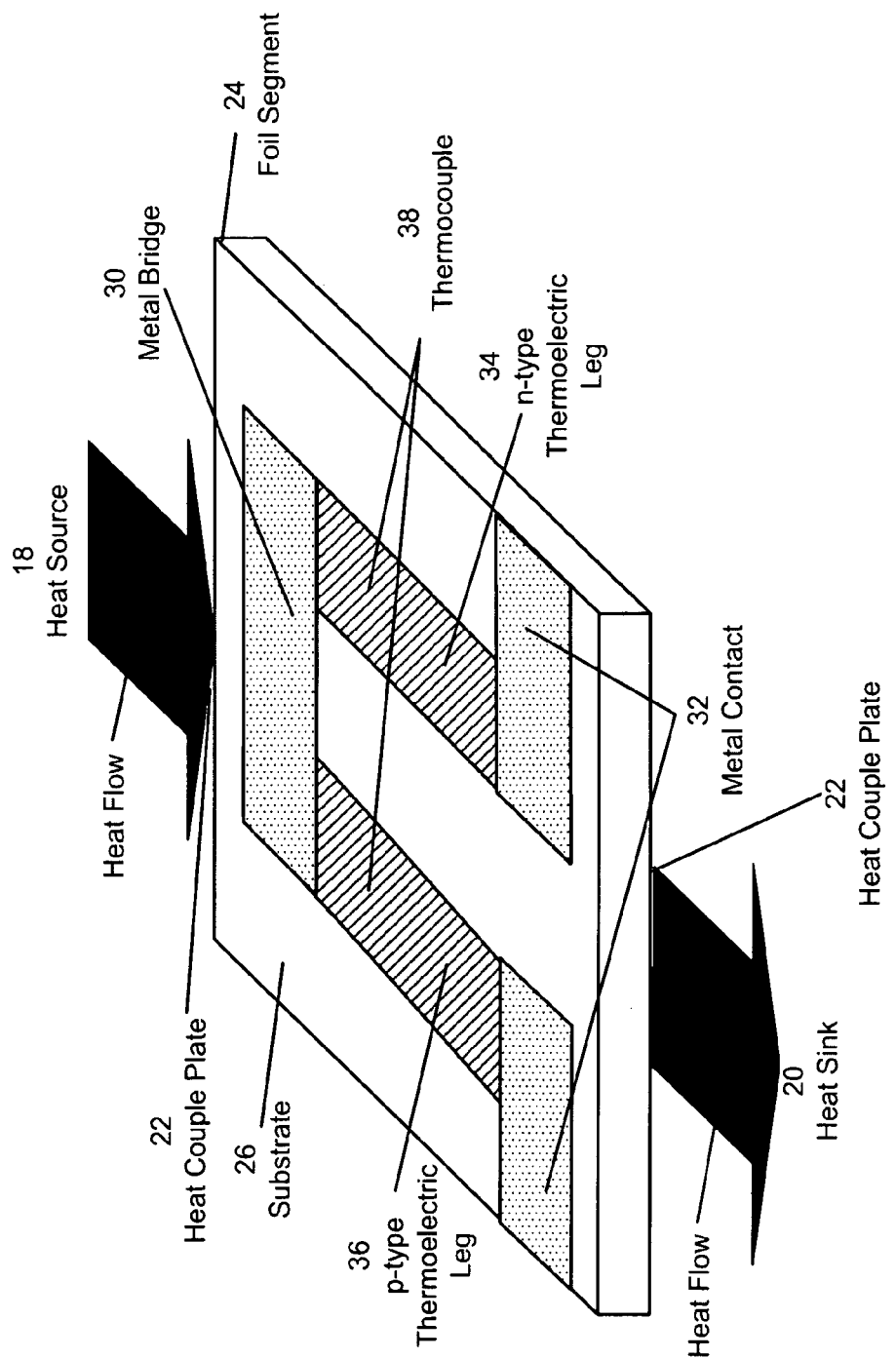
FIG. 2 is a perspective view of the in-plane thermoelectric generator illustrating the basic configuration of p-type and n-type thermoelectric legs deposited onto a substrate using thin film technologies.

As was earlier mentioned, a common arrangement for in-plane thermoelectric generator 12 configurations is to construct such devices as a foil segment 24 or series of foil segments 24 having a relatively large number of thermocouples 38 which are themselves electrically connected in series. The p-type and n-type thermoelectric legs 36, 34 which make up the thermocouples 38 are connected using metal bridges 30 and metal contacts 32 as is shown in FIG. 2. Such metal bridges 30 and metal contacts 32 may be deposited onto the substrate 26 after deposition of the p-type and n-type thermoelectric legs 36, 34 in order to form the thin film thermoelectric structure that makes up the in-plane thermoelectric generator 12 configuration.

The in-plane thermoelectric generator may be fabricated by a number of alternative technologies. For example, the in-plane thermoelectric generator may be fabricated using MEMS silicon-based technology such as that described in the document entitled "A Thermoelectric Converter for Energy Supply" by H. Glosch et al. and reprinted in the publication entitled Sensors and Actuators, No. 74 (1999) Pages 246-250. Additionally, the in-plane thermoelectric generator may be fabricated using silicon technology such as that described in the document entitled "Miniaturized Thermoelectric Generators Based on Poly-Si and Poly-SiGe Surface Micromachining" by M. Strasser et al. of Infineon Technologies A.G., Wireless Products, Microsystems and Munich University of Technology, Institute for Physics of Electrotechnology.

A further description of silicon-based technology for fabricating the in-plane thermoelectric generator is provided in the document entitled "Analysis of a CMOS Low Power Thermoelectric Generator" by M. Strasser et al. of Infineon Technologies and Munich University of Technology. The in-plane thermoelectric generator may further fabricated using electroplating technology similar to that disclosed in the document entitled "Microfabrication of Thermoelectric Generators on Flexible Foil Substrates as Power Source for Autonomous Microsystems" by Wenmin Qu et al. and published in The Journal of Micromechanics and Microengineering, 11 (2001), pages 146-152.

In an alternative arrangement, the relatively high density of thermocouples 38 can be achieved utilizing stacking of the substrates 26. Furthermore, the foil segment 24 or substrate 26 may be rolled into a spiral shape in order to produce a round-shaped thermoelectric generator similar to that disclosed in U.S. Patent Publication Serial No. 20060151021 and entitled LOW POWER THERMOELECTRIC GENERATOR. A spaced pair of heat couple plates 22 (i.e., top and bottom plates) may be attached such as by bonding to the stack or roll of thin films (i.e., thermocouples 38 deposited on substrate 26) in order to provide thermal connection thereacross and also to allow for connection of the thermoelectric generator to an external heat source 18 and a heat sink 20.

Electrical connection of the in-plane thermoelectric generator 12 to the initial energy management assembly 40 can be facilitated using at least one of the heat couple plates 22 (i.e., one of the top and bottom plates) or by directly connecting opposing ends of the thermocouple chain to the initial energy management assembly 40. In using the heat couple plates 22 to make the connection, the top plate and bottom plate are preferably fabricated of electrically conductive material such as metallic material.

An inner surface of the heat couple plates 22 is preferably coated with a non-electrically conductive coating except at the extreme ends of the series of alternating n-type and p-type thermoelectric legs 34, 36 wherein the non-electrically conductive coating is locally omitted. The heat couple plates 22 (i.e., top or bottom plate) are, in turn, electrically connected to respective ones of opposing ends of the series of alternating n-type and p-type thermoelectric legs 34, 36. The heat couple plates 22 are then electrically connectable to the initial energy management assembly 40 similar to the electrical connection of a watch battery to a watch.

Alternatively, the in-plane thermoelectric generator 12 may be connected to the initial energy management assembly 40 by direct connection to the ends of the thermocouple chain of the in-plane thermoelectric generator 12. More specifically, in such an arrangement, the heat couple plates 22 (i.e., top and bottom plated) may be fabricated of electrically non-conductive material such as relatively-highly-thermally-conductive ceramic material or other suitable material with a relatively high thermal conductivity. Alternatively, at least one of the inside surfaces of the heat couple plates 22 may be coated with a non-electrically conductive coating.

In another embodiment, the thermally conductive glue or adhesive which bonds the top and bottom plates to the foil segments as described in U.S. Pat. No. 6,958,443 is preferably electrically non-conductive and therefore eliminates the need for a separate non-electrically conductive coating. Furthermore, it is contemplated that the heat couple plates 22 (i.e., top and bottom plates) may be fabricated of electrically conductive material (e.g., metallic) which is electrically insulated from the foil segments 24 by the non-electrically conductive coating and/or by the non-electrically conductive glue which bonds the foil segments 24 to the top and bottom plates. The thermoelectric power supply 10 may include electrically conductive wiring for connecting the respective ones of opposing ends of the series of alternating n-type and p-type thermoelectric legs 34, 36 to the initial energy management assembly 40.

Figure 3:
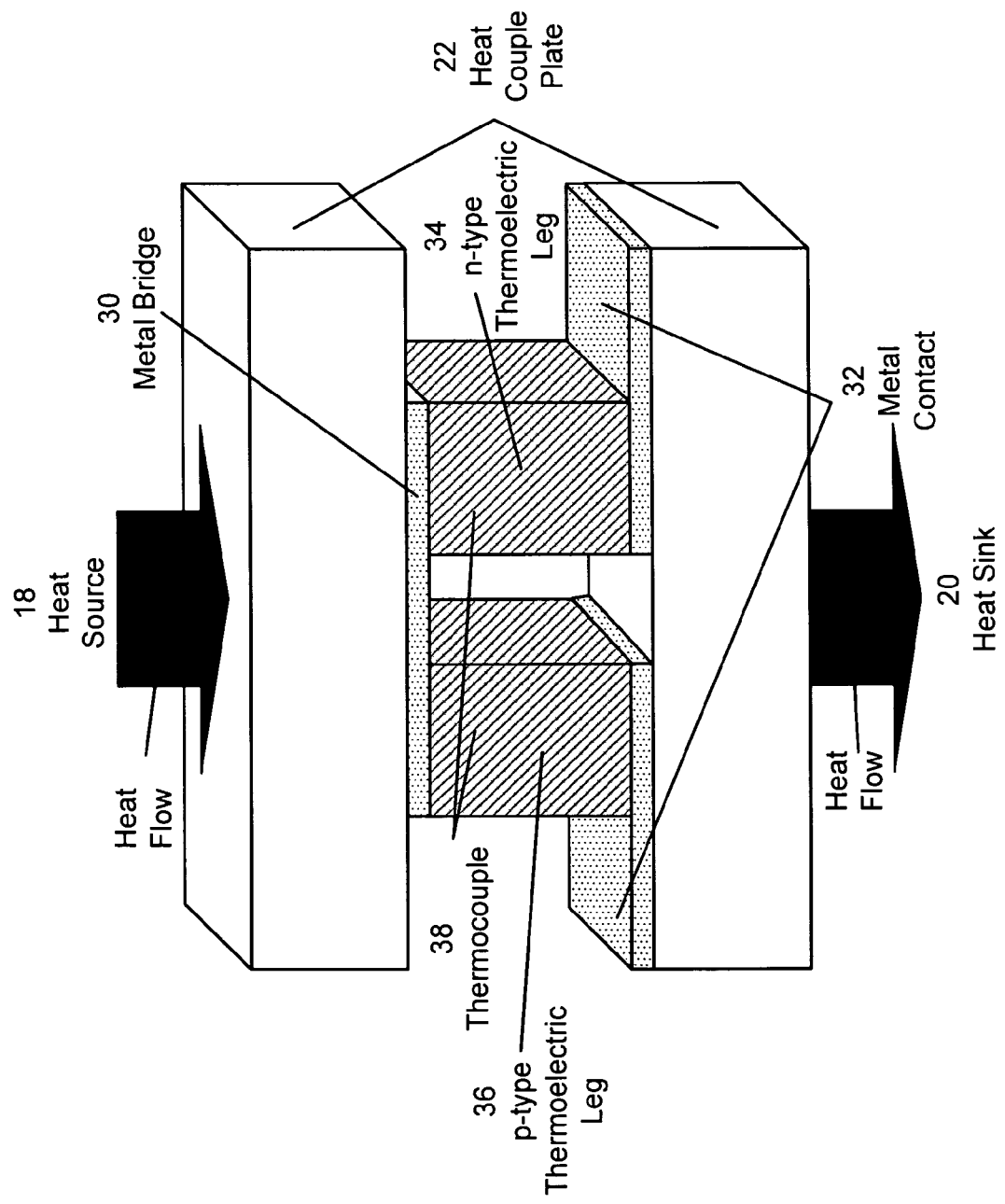
FIG. 3 is a perspective view of the cross-plane thermoelectric generator wherein a spaced pair of heat couple plates is configured in a checkerboard arrangement of p-type and n-type thermoelectric legs.

Regarding the construction of the cross-plane thermoelectric generator 14, its configuration as shown in FIG. 3 may be fabricated using bulk polycrystalline material such as is utilized in standard Peltier coolers known in the art. In this typical configuration, the length of the p-type and n-type thermoelectric legs 36, 34 is in the millimeter range for configurations utilizing bulk polycrystalline material. Alternatively, for construction methodologies using thin film technology in order to produce the cross-plane thermoelectric generator 14, the length of the thermoelectric legs may be in a range of several tens of microns. In this configuration, heat couple plates 22 that are arranged on upper and lower ends of the spaced pair of thermoelectric legs act as the substrate 26 for the thin film deposition.

Advantageously, the arrangement as shown in FIG. 3 for the cross-plane thermoelectric generator 14 provides a relatively low electrical resistance due to the relatively small quantity of thermocouples 38 that are arranged in series. In addition, low electric resistance of the cross-plane thermoelectric generator 14 configuration is a result of the relatively small ratio of length of n-type and p-type thermoelectric legs 34, 36 to cross-sections thereof. In contrast to the arrangement for the in-plane thermoelectric generator 12, the relatively small aspect ratio of the thermoelectric legs in the cross-plane thermoelectric generator 14 results in a relatively high power output.

In addition, due to the lack of a substrate 26 interconnecting the heat couple plates 22 as is present in the in-plane thermoelectric generator 12, the cross-plane thermoelectric generator 14 provides a relatively high efficiency capability for converting thermal energy into electrical energy. This is a result of the lack of parasitic heat flow through the substrate 26 as is present in the in-plane thermoelectric generator 12 configuration. Advantageously, this arrangement results in heat flowing only through the thermoelectric legs. Unfortunately, the advantages provided by the small aspect ratio (i.e., low electrical resistance and high power output) also means that the cross-plane thermoelectric generator 14 exhibits relatively low thermal resistance due to the same low aspect ratio.

More specifically, the relatively low ratio of length of the thermoelectric legs to cross-section thereof leads to low thermal resistance resulting in a relatively large amounts of heat flow through the device. An unfavorable characteristic of the cross-plane thermoelectric generator 14 are associated with the relatively limited quantity of thermocouples 38 that may be electrically connected in series while still minimizing the overall size of the device. This limited number of thermocouples 38 results in a relatively low voltage output at small temperature gradients despite the high power capabilities.

The cross-plane thermoelectric generator 14 may be fabricated by a variety of thin film technologies described in the documents mentioned below. For example, the cross-plane thermoelectric generator 14 may be fabricated by using thin film technologies described in the document entitled "Micropelt Miniaturized Thermoelectric Devices: Small Size, High Cooling Power Densities, Short Response Time" by H. Boettner of the Fraunhofer Institute Physikalische Messtechnik (IPM), Freiburg, Germany, or in the article entitled "Micropelt: State of the Art, Roadmap and Applications" also by H. Boettner as well as that described in the document entitled "New Thermoelectric Components Using Microsystem Technologies" also by H. Boettner et al. Various electroplating technology techniques (e.g., galvanic processing) for the cross-plane thermoelectric generator 14 can be used such as is described in the disclosure entitled "Thermoelectric Microdevice Fabricated by a MEMS-Like Electrochemical Process" by G. Jeffrey Snyder et al. of Jet Propulsion Laboratory, California Institute of Technology and published on-line on 27 Jul. 2003, incorporated by reference in its entirety.

In addition, the cross-plane thermoelectric generator 14 may be fabricated using bulk polycrystalline thermoelectric material and mechanical cutting technology of bulk polycrystalline thermoelectric material. The bulk polycrystalline thermoelectric material may be prepared from melts (i.e., liquids) and/or by powder technology techniques and/or by mechanical alloying.

Advantageously, the thermoelectric power supply 10 of the present invention combines in-plane and cross-plane thermoelectric generators 12, 14 in a unique arrangement that takes advantage of the benefits of each device in order to provide electrical power output that is compatible for many microelectronic devices that consume relatively high power. More specifically, the in-plane thermoelectric generator 12 configuration is capable of providing the necessary voltage for operating many modern microelectronic devices in the 1.5 to 3 volt range but are incapable of producing the required amount of power due to the relatively low current at which such electrical energy is provided. Such low electrical current is a result of the high electric internal resistance of the in-plane thermoelectric generator 12 design.

Conversely, the cross-plane thermoelectric generator 14 configuration is capable of producing the amount of power compatible for many electronic devices 62 due to its low internal resistance which results in a relatively high electrical current. However, the power output of the cross-plane thermoelectric generator 14 at the relatively small temperature gradients results in a thermoelectric voltage that is generally too low for operating many electronic circuitry.

However, by including the voltage converter 58 in the thermoelectric power supply 10 of the present invention, the relatively high power output at low voltage of the cross-plane thermoelectric generator 14 may be exploited by the voltage converter 58 by increasing the voltage of the cross-plane thermoelectric generator 14. The voltage converter 58 does this using the principle of a charge pump 60. The voltage converter 58 then supplies electrical energy directly to the final energy management assembly 64.

As illustrated in FIG. 1, the final energy management assembly 64 is connected to the voltage converter 58 and receives power therefrom. The voltage converter 58 is activated or powered by electrical energy produced initially by the in-plane thermoelectric generator 12 after processing thereof by the initial energy management assembly 40. More specifically, the final energy management assembly 64 is adapted to rectify and limit voltage received from the cross-plane thermoelectric generator 14, charge an energy storage element 50 such as a capacitor 52 or a rechargeable thin film battery 54 contained within the final energy management assembly 64, and detect the charging state of the energy storage element 50 utilizing a voltage detector 56.

More specifically, the detection capability of the voltage detector 56 allows the final energy management assembly 64 to release power to the electronic device 62 upon detection of a sufficient level of electrical energy in the energy storage element 50. As shown in FIG. 1, the final energy management assembly 64 releases power to a device such as a microelectronic device in order to power the device which may be any number of applications including, but not limited to, microelectronics, and sensor systems.

Optionally, a portion of the energy released by the final energy management assembly 64 may be re-circulated back to the voltage converter 58 in order to provide power for its voltage multiplication purposes. In such a configuration, the power requirements as well as size and, ultimately, cost, of the in-plane thermoelectric generator 12 may be reduced. In addition, the power requirements, size and cost of the initial energy management assembly 40 may also be reduced as the initial energy management assembly 40 would then only be required to operate to initiate or start the voltage converter 58 after which operation of the initial energy management assembly 40 would no longer be required. Optionally, if power produced by the initial energy management assembly 40 is not required to drive the voltage converter 58, such power may be delivered to the final energy management assembly 64 where it may be stored in the energy storage element 50.

In addition, the thermoelectric power supply 10 of the present invention may be configured to include a relatively large energy storage element 50 such as a rechargeable thin film battery 54 or a capacitor 52 in electrical communication with the final energy management assembly 64. Such relatively large energy storage element 50 may be configured to store excess energy not required by the final electronic device 62 and/or voltage converter 58.

Regarding the specific architecture of the initial energy management assembly 40, it is contemplated that the initial energy management assembly 40 functions to rectify and limit the thermoelectric voltage produced by the in-plane thermoelectric generator 12, protect against the generation of excess voltage, initially provide energy storage capability in the form of an energy storage element 50, as well as provide the capability of voltage regulation in order to regulate the point at which power is released to the voltage converter 58.

Rectifying of the thermoelectric voltage may be facilitated through the use of a diode 44 in order to provide voltage with only one polarity regardless of the direction of temperature flow or temperature gradient. Alternatively, the rectifier 42 may be adapted to enable exploitation of temperature gradient regardless of the direction of heat flow by utilizing a diode bridge 46. Further embodiments may include at least one diode to block the discharge of energy storage by the in-plane and/or cross-plane thermoelectric generators 12, 14.

The initial energy management assembly 40 may also provide excess voltage protection such as by utilizing a Zener diode, a single diode 44 or a plurality of diodes 44 arranged in series in a manner well known in the art. Initial energy storage elements 50 may include small capacitors 52 or a rechargeable thin film battery configured to accumulate sufficient energy in order to activate the voltage converter 58. Voltage detection may be facilitated through the use of a switch or switches at defined voltage thresholds which correspond to the amount of energy stored. Over a pre-determined threshold, charges in the storage element may be released as power to the voltage converter 58. Under that pre-determined threshold, electrical current flow may be interrupted or prevented.

As was earlier mentioned, the voltage converter 58 is specifically adapted to convert the relatively low voltage but high power output of the cross-plane thermoelectric generator 14 into a usable high voltage using the principle of voltage multiplication in the manner of a charge pump 60. In this manner, the thermoelectric power supply 10 is capable of powering or driving electronics such as energy management systems, a final electronic application and/or the voltage converter 58 itself.

The final energy management assembly 64 may be adapted to provide similar capabilities as was described above for the initial energy management assembly 40. In this regard, the final energy management assembly 64 is preferably adapted to rectify thermoelectric voltage in order to provide voltage at one polarity for heat flow in opposite directions utilizing a diode 44 or diode bridge 46. The final energy management assembly 64 is also preferably adapted to provide for excess voltage protection to prevent damage to the final electronic application as well as including an energy storage element 50 such as a small capacitor 52 or rechargeable thin film battery 54 in order to power the application to which the thermoelectric power supply 10 is connected.

Optionally, an additional energy storage element 50 such as a relatively large rechargeable thin film battery 54 or capacitor 52 may be integrated into the final energy management assembly 64 in order to allow for accumulation of excess energy that is not required to power the electrical device. Like the initial energy management assembly 40, the final energy management assembly 64 may further include a voltage detector 56 to determine and regulate the release of energy to the microelectronic device or application to which the thermoelectric power supply 10 is connected.

In each of the above arrangements, the features of the initial energy management assembly 40 and final energy management assembly 64 are optimized according to the specific application and thermal environment in which the thermoelectric power supply 10 operates. More specifically, the above described features of the initial and final energy management assemblies may be reduced according to the requirements of the device to be powered by the thermoelectric generator as well as in accordance with the characteristics of the thermal environment within which the thermoelectric power supply 10 operates.

Figure 4:
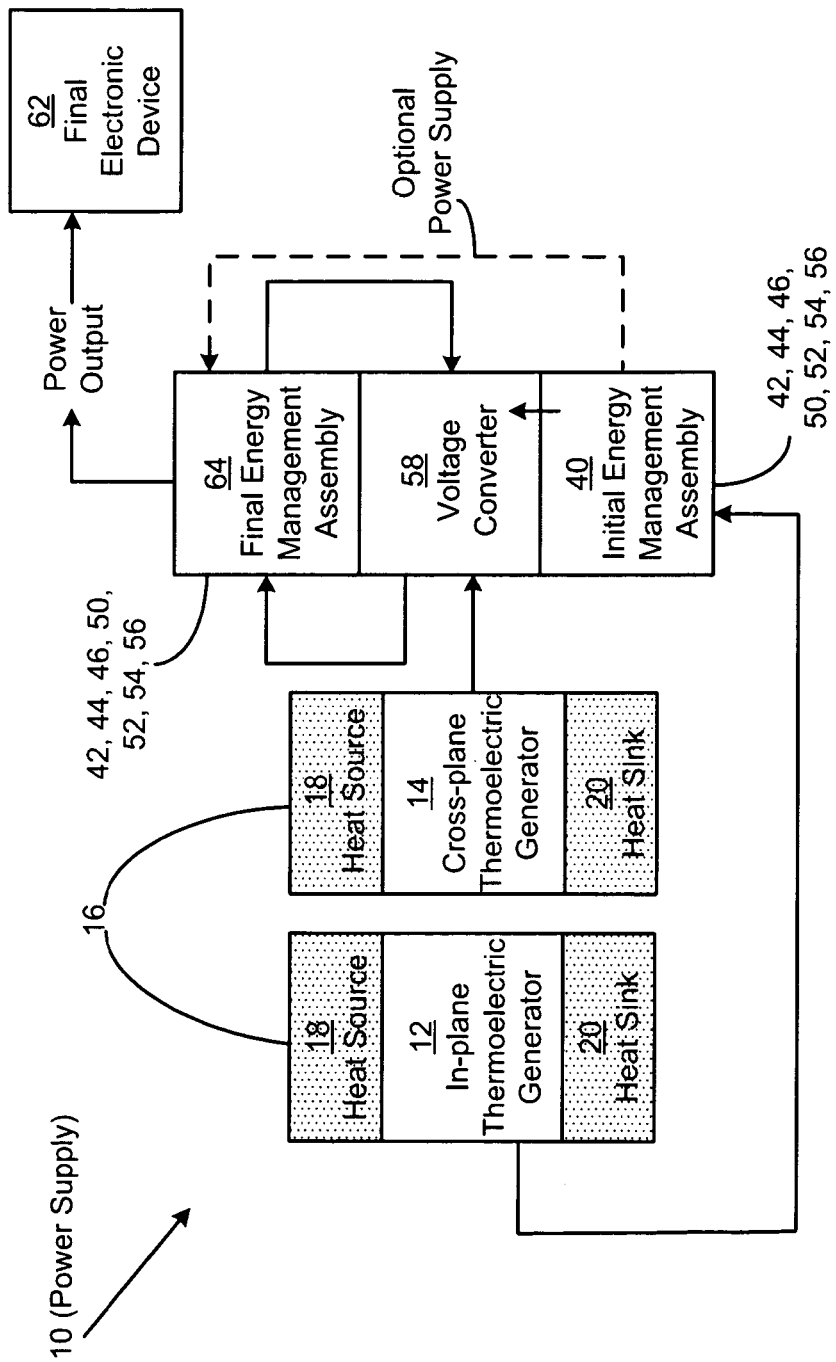
FIG. 4 is a schematic diagram of the thermoelectric power supply in an alternative embodiment wherein the in-plane and cross-plane thermoelectric generators are constructed as separate elements and wherein the initial energy management assembly, voltage converter and final energy management assembly are integrated, for example, into a unitary electronic assembly.
Figure 5:
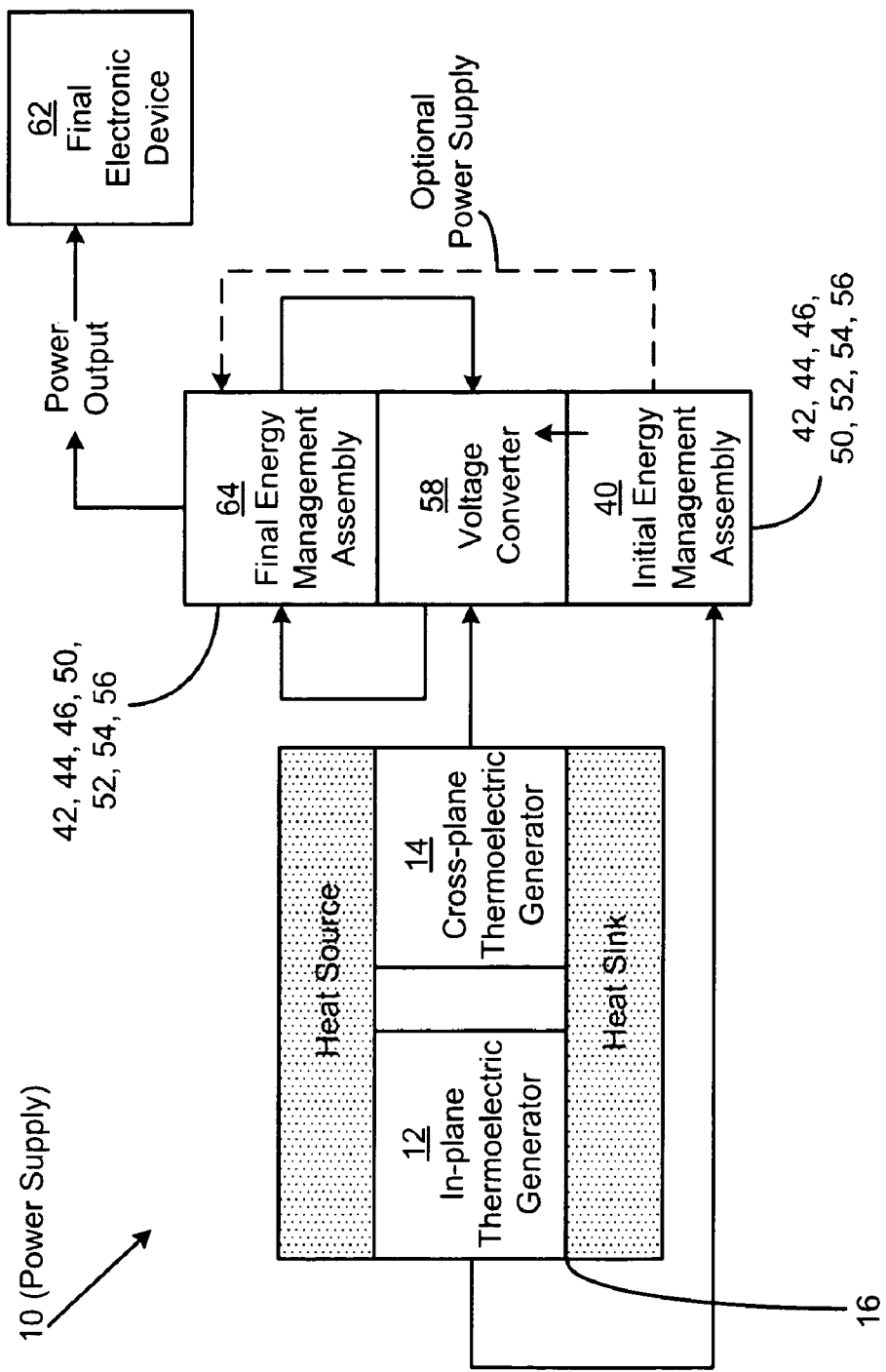
FIG. 5 is a schematic diagram of the thermoelectric power supply in a further alternative embodiment wherein the in-plane and cross-plane thermoelectric generators share the same heat couple plates similar to that illustrated in FIG. 1 but wherein the initial and final energy management assemblies are integrated with the voltage converter into a unitary electronic assembly.

Alternative embodiments or arrangements for the components of the thermoelectric power supply 10 are shown in FIGS. 4 and 5. In FIG. 4, shown is an arrangement wherein the in-plane thermoelectric generator 12 is constructed as a separate entity from the cross-plane thermoelectric generator 14. As shown in FIG. 1, the in-plane and cross-plane thermoelectric generators 12, 14 may be configured to share a common heat source 18 and heat sink 20.

Conversely, as shown in FIG. 4, it is contemplated that the thermoelectric power supply 10 may be arranged such that the in-plane and cross-plane thermoelectric generators 12, 14 have separate heat couple plates 22 for heat source 18 and heat sink 20 purposes. In addition, FIG. 1 illustrates the other components of the initial and final energy management assemblies 40, 64 and voltage converter 58 being provided as separate components which are electrically connected together.

In yet another alternative arrangement shown in FIG. 5, the thermoelectric power supply 10 may be arranged such that the in-plane and cross-plane thermoelectric generators 12, 14 share a common heat source 18 and heat sink 20 (i.e., common heat couple plates 22) as opposed to the separate heat couple plates 22 of FIG. 4.

However, as shown in FIG. 5, the in-plane and cross-plane thermoelectric generators 12, 14 may be integrated into a unitary structure which may, in turn, be electrically connected to an assembly comprising the initial and final energy management assemblies 40, 64 and the voltage converter 58. As was earlier mentioned, the in-plane thermoelectric generator 12 may be provided in several arrangements including, but not limited to, a stack of thermopiles each comprising a substrate 26 having the thermoelectric legs disposed thereon and which are interconnected using metal bridges 30 and metal contacts 32.

Alternatively, the in-plane thermoelectric generator 12 may be arranged as a spiral of a continuous substrate 26 wherein a relatively large number of thermoelectric legs are connected in series wherein substrate 26 portions may be connected end to end using metal contacts 32 between the substrates 26 to electrically connect the thermoelectric legs in series. The spiral or stack of the thermopile structure may have the heat couple plates 22 disposed on upper and lower ends in order to thermally connect to a heat source 18 and heat sink 20. In a final embodiment, it is contemplated that each of the components that make-up the thermoelectric power supply 10 may be integrated into a unitary structure and encapsulated to form a convenient assembly which may be adapted for use in many common microelectronic devices.

The description of the various embodiments of the present invention is presented to illustrate preferred embodiments thereof and other inventive concepts may be otherwise variously embodied and employed. The appended claims are intended to be construed to include such variations except insofar as limited by the prior art.

What is claimed is:

1. A thermoelectric power supply, comprising:
   an in-plane thermoelectric generator adapted to generate a relatively high voltage at relatively low power in response to a temperature gradient acting across the in-plane thermoelectric generator;
   an initial energy management assembly connected to and adapted to receive electrical power generated by the in-plane thermoelectric generator;
   a voltage converter connected to the initial energy management assembly and receiving electrical energy at relatively high voltage therefrom for initially activating the voltage converter; and
   a cross-plane thermoelectric generator adapted to generate a relatively high power at relatively low voltage in response to a temperature gradient acting across the cross-plane thermoelectric generator, the voltage level of energy produced by the cross-plane thermoelectric generator being increased by the voltage converter after initial activation thereof by electrical energy received from the initial energy management assembly.

2. The thermoelectric power supply of claim 1 farther comprising a final energy management assembly connected to the voltage converter for processing power for use by an electronic device connected to the thermoelectric power supply.

3. The thermoelectric power supply of claim 2 wherein the initial and final energy management assemblies and the voltage converter are integrated into a unitary electronic assembly.

4. The thermoelectric power supply of claim 2 wherein the initial and final energy management assemblies each include an energy storage element.

5. The thermoelectric power supply of claim 2 wherein the initial and final energy management assemblies are configured to rectify and limit voltage received from respective ones of the in-plane and cross-plane thermoelectric generators.

6. The thermoelectric power supply of claim 4 wherein the final energy management assembly is configured to release power to an electronic device upon detection of a sufficient level of electrical energy in the energy storage element.

7. The thermoelectric power supply of claim 4 wherein the initial energy management assembly is configured to release power to the voltage converter upon detection of a sufficient level of electrical energy in the energy storage element.

8. The thermoelectric power supply of claim 1 wherein the in-plane thermoelectric generator is fabricated using micro-electro-mechanical system (MEMS) technology.

9. The thermoelectric power supply of claim 1 wherein the in-plane thermoelectric generator is fabricated using silicon-based technology.

10. The thermoelectric power supply of claim 9 wherein the in-plane thermoelectric generator is fabricated using a complementary metal-oxide semiconductor (CMOS) fabrication process.

11. The thermoelectric power supply of claim 1 wherein the in-plane thermoelectric generator comprises:
 a plurality of spaced parallel foil segments electrically connected in series and thermally connected to and interposed between a top plate and a bottom plate, each one of the foil segments comprising:
 a substrate having opposing front and back substrate surfaces; and
 a series of elongate alternating n-type and p-type thermoelectric legs disposed in spaced parallel arrangement on the front substrate surface, each of the n-type and p-type legs being formed of a thermoelectric material;
 wherein each one of the p-type thermoelectric legs is electrically connected to an adjacent one of the n-type thermoelectric legs at opposite ends of the p-type thermoelectric legs such that the series of n-type and p-type thermoelectric legs are electrically connected in series and thermally connected in parallel.

12. The thermoelectric power supply of claim 11 wherein:
 at least one of the top plate and bottom plate is fabricated of electrically conductive material and is electrically connected to respective ones of opposing ends of the series of alternating n-type and p-type thermoelectric legs;
 at least one of the top and bottom plates being electrically connectable to the initial energy management assembly.

13. The thermoelectric power supply of claim 11 wherein:
 the top and bottom plates are fabricated from at least one of electrically conductive material and electrically non-conductive material;
 the thermoelectric power supply includes electrically conductive wiring for connecting the respective ones of opposing ends of the series of alternating n-type and p-type thermoelectric legs to the initial energy management assembly.

14. The thermoelectric power supply of claim 11 wherein the n-type and p-type thermoelectric legs are formed of a $Bi_2Te_3$-type thermoelectric material.

15. The thermoelectric power supply of claim 1 wherein the in-plane thermoelectric generator comprises:
 a top plate and a bottom plate disposed in spaced parallel relation to one another; and
 a spirally wound foil segment captured between and thermally interconnecting the top and bottom plates, the foil segment comprising:
 an elongate substrate having top and bottom edges and including opposing front and back substrate surfaces; and
 a series of elongate alternating n-type and p-type thermoelectric legs disposed in spaced parallel arrangement on the front substrate surface;
 wherein each one of the p-type thermoelectric legs is electrically connected to adjacent ones of the n-type thermoelectric legs at opposite ends of the p-type thermoelectric legs such that the n-type and p-type thermoelectric legs are electrically connected in series and thermally connected in parallel.

16. The thermoelectric power supply of claim 15 wherein:
 at least one of the top plate and bottom plate is fabricated of electrically conductive material and is electrically connected to respective ones of opposing ends of the series of alternating n-type and p-type thermoelectric legs;
 at least one of the top and bottom plates being electrically connectable to the initial energy management assembly.

17. The thermoelectric power supply of claim 15 wherein:
 the top and bottom plates are fabricated from at least one of electrically conductive material and electrically non-conductive material;
 the thermoelectric power supply includes electrically conductive wiring for connecting the respective ones of opposing ends of the series of alternating n-type and p-type thermoelectric legs to the initial energy management assembly.

18. The thermoelectric power supply of claim 15 wherein the n-type and p-type thermoelectric legs are formed of a $Bi_2Te_3$-type thermoelectric material.

19. The thermoelectric power supply of claim 1 wherein the cross-plane thermoelectric generator is fabricated using micro-electro-mechanical system (MEMS) technology.

20. The thermoelectric power supply of claim 1 wherein the cross-plane thermoelectric generator is fabricated using electroplating technology.

21. The thermoelectric power supply of claim 1 wherein the cross-plane thermoelectric generator has a plurality of n-type and p-type thermoelectric legs formed of a bulk polycrystalline thermoelectric material.

22. The thermoelectric power supply of claim 1 wherein the cross-plane thermoelectric generator is fabricated by depositing thin films of thermoelectric material onto wafers having pre-structured electrodes.

23. The thermoelectric power supply of claim 22 wherein the thermoelectric material is $Bi_2Te_3$-type material.

24. The thermoelectric power supply of claim 1 wherein the voltage converter is configured to operate as a charge pump to increase the voltage level of energy produced by the cross-plane thermoelectric generator.

25. The thermoelectric power supply of claim 1 wherein the in-plane and cross-plane thermoelectric generators include a common top plate and common bottom plate and the in-plane and cross-plane thermoelectric generators are integrated into a unitary structure.

26. The thermoelectric power supply of claim 2 wherein the in-plane thermoelectric generator, initial and final energy management assemblies, voltage converter, and cross-plane thermoelectric generator are integrated into a unitary structure.

27. An in-plane thermoelectric generator for use in a thermoelectric power supply comprising an initial energy management assembly, a cross-plane thermoelectric generator, a voltage converter and a final energy management assembly, the initial energy management assembly being connected to and adapted to receive electrical power from the in-plane thermoelectric generator, the voltage converter being connected to the initial energy management assembly and receiving energy at high voltage therefrom for initially activating the voltage converter, the cross-plane thermoelectric generator being adapted to generate electrical energy at relatively high power and low voltage in response to a temperature gradient acting across the cross-plane thermoelectric generator, the voltage level of energy produced by the cross-plane thermoelectric generator being increased by the voltage converter after initial activation thereof by electrical energy received from the initial energy management assembly, the in-plane thermoelectric generator comprising:

at least one foil segment oriented orthogonally relative to a spaced pair of heat couple plates and being in thermal communication with the plates, the foil segment comprising:

a substrate having opposing front and back substrate surfaces; and a series of elongate alternating n-type and p-type thermoelectric legs disposed in spaced parallel arrangement on the front substrate surface, each of the n-type and p-type legs being formed of a thermoelectric material;

wherein each one of the p-type thermoelectric legs is electrically connected to an adjacent one of the n-type thermoelectric legs at opposite ends of the p-type thermoelectric legs such that the series of n-type and p-type thermoelectric legs are electrically connected in series and thermally connected in parallel.

28. The in-plane thermoelectric generator of claim 27 wherein the n-type and p-type thermoelectric legs are formed of a $Bi_2Te_3$-type thermoelectric material.

* * * * *